(12) United States Patent
Nagatani et al.

(10) Patent No.: US 8,509,349 B2
(45) Date of Patent: Aug. 13, 2013

(54) TRANSMITTER AND DISTORTION COMPENSATING METHOD

(75) Inventors: Kazuo Nagatani, Kawasaki (JP);
Hiroyoshi Ishikawa, Kawasaki (JP);
Nobukazu Fudaba, Kawasaki (JP);
Yuichi Utsunomiya, Kawasaki (JP);
Toshio Kawasaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 74 days.

(21) Appl. No.: 13/357,504

(22) Filed: Jan. 24, 2012

(65) Prior Publication Data
US 2012/0224654 A1 Sep. 6, 2012

(30) Foreign Application Priority Data
Mar. 1, 2011 (JP) ................................. 2011-044260

(51) Int. Cl.
*H04B 15/00* (2006.01)

(52) U.S. Cl.
USPC ............. 375/297; 375/295; 375/296; 455/91; 455/114.2; 455/114.3; 455/115.1; 455/115.2; 455/115.3

(58) Field of Classification Search
USPC ................ 375/295, 296, 297; 455/31, 114.2, 455/114.3, 115.1, 115.2, 115.3
See application file for complete search history.

(56) References Cited

U.S. PATENT DOCUMENTS

| | | | |
|---|---|---|---|
| 6,859,099 B2 * | 2/2005 | Akaiwa | ........................ 330/149 |
| 7,991,073 B2 | 8/2011 | Utsunomiya et al. | |
| 8,385,857 B2 * | 2/2013 | Suzuki et al. | .............. 455/127.1 |

FOREIGN PATENT DOCUMENTS

| | | |
|---|---|---|
| JP | 2009-126272 A | 6/2009 |
| JP | 2010-147805 A | 7/2010 |

* cited by examiner

*Primary Examiner* — Siu Lee
(74) *Attorney, Agent, or Firm* — Fujitsu Patent Center

(57) ABSTRACT

A transmitter, when the power changes at a certain timing, adjusts the gain for the transmission signal before the application of the distortion compensation process correspondingly to the amplitude of the transmission signal at the certain timing based on the average of the power of a transmission signal before application of the distortion compensation process, obtains a distortion compensation coefficient corresponding to the value of the power of the adjusted transmission signal from the LUT, applies the distortion compensation process to the transmission signal using the obtained distortion compensation coefficient, calculates an update for a distortion compensation coefficient corresponding to the obtained distortion compensation coefficient and stored in the LUT based on an error between the power of the transmission signal amplified by an amplifier and the power of the transmission signal before the application of the distortion compensation process, and updates the LUT using the calculated update.

6 Claims, 10 Drawing Sheets

TRANSMITTER AND DISTORTION COMPENSATING METHOD

CROSS-REFERENCE TO RELATED APPLICATION

This application is based upon and claims the benefit of priority of the prior Japanese Patent Application No. 2011-044260, filed on Mar. 1, 2011, the entire contents of which are incorporated herein by reference.

FIELD

The embodiments discussed herein are directed to a transmitter and a distortion compensating method.

BACKGROUND

It is desirable that a power amplifier used in a transmitter such as one used in a base station device used for a wireless communication has highly power-efficient. However, because the linearity and the power efficiency of a power amplifier are characteristics that are in trade-off relationship, when the power amplifier is used in a high linearity region, the power efficiency is reduced. Thus, to enable the power amplifier to operate highly efficiently, the power amplifier is used in a low linearity region.

Because the quality of transmission signals degrades when an amplifier is operated in a low linearity region near the saturation region, as a technology for compensating for a distortion in the amplifier for a transmitter, predistortion, for example, has been suggested. Predistortion is a method for improving the linearity by adding reverse characteristics of the amplifier beforehand to signals input to the amplifier so that the distortion at the output end of the amplifier is cancelled out. The transmitter is provided with distortion compensation coefficients representing reverse characteristics of those of transmission signals with a certain average power, reads a distortion compensation coefficient correspondingly to the instantaneous amplitude of a transmission signal, and generates a predistortion signal by adding the distortion compensation coefficient to the transmission signal. The transmitter also calculates an update for a distortion compensation coefficient based on the transmission signal and an output signal fed back from the amplifier, and updates the distortion compensation coefficient stored in a distortion compensation coefficient table. The transmitter then executes these processes repeatedly to update the distortion compensation coefficients contained in the distortion compensation coefficient table, and converges the distortion compensation coefficients. In this manner, the transmitter compensates for the distortions in the amplifier, and suppresses the degradation of the signal quality. Related-art examples are described in Japanese Laid-open Patent Publication No. 2010-147805.

However, according to the conventional technology, the distortion compensation coefficient is re-calculated when the average transmission power changes. Therefore, depending on the degree of the change in the average power, the transmitter might require some time to converge the distortion compensation coefficients. For example, when the degree of the change in the average power is small, the distortion compensation coefficient hardly changes from the one before the change in the average power. Therefore, the number of times the distortion compensation coefficient updating operation is performed can be reduced. Thus, the time required to converge the distortion compensation coefficients is reduced as well. On the contrary, if the average power changes by a large degree, the distortion compensation coefficients will be changed by a large degree. Therefore, the time required to converge the distortion compensation coefficients will be extended.

SUMMARY

According to an aspect of an embodiment of the invention, a transmitter executing a distortion compensation process for compensating for a distortion in an output of an amplifier in advance by applying a reverse characteristic to a transmission signal before being amplified by the amplifier includes a distortion compensation coefficient storage unit that stores therein a value of power of a transmission signal and a distortion compensation coefficient that is used in the distortion compensation process in an associated manner, a power meter that measures power of the transmission signal before application of the distortion compensation process, a gain adjusting unit that adjusts a gain for the transmission signal before application of the distortion compensation process, when power of a transmission signal changes at certain timing based on an average of the power measured by the power meter, correspondingly to amplitude of the transmission signal at the certain timing, a distortion compensation processing unit that obtains a distortion compensation coefficient corresponding to the value of power of the transmission signal after being adjusted by the gain adjusting unit from the distortion compensation coefficient storage unit, and performs the distortion compensation process to the transmission signal using the distortion compensation coefficient thus obtained, and a distortion compensation coefficient updating unit that calculates an update for the distortion compensation coefficient stored in the distortion compensation coefficient storage unit and corresponding to the distortion compensation coefficient obtained by the distortion compensation processing unit based on an error between power of the transmission signal amplified by the amplifier and power of the transmission signal before the application of the distortion compensation process, and updates the distortion compensation coefficient stored in the distortion compensation coefficient storage unit using the update thus calculated.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

DESCRIPTION OF EMBODIMENTS

Preferred embodiments of the present invention will be explained with reference to accompanying drawings. It is to be understood that both the foregoing general description and following detailed description are exemplary and explanatory and are not restrictive of the embodiments, as claimed. Furthermore, each of these embodiments may be combined as appropriate within the scope where content does not contradict. Furthermore, in the embodiments explained hereunder, a transmitter such as one included in a base station device is used as an example of the transmitter.

[a] First Embodiment

Relationship Between Signals Input to Amplifier and Gain

Figure 1:
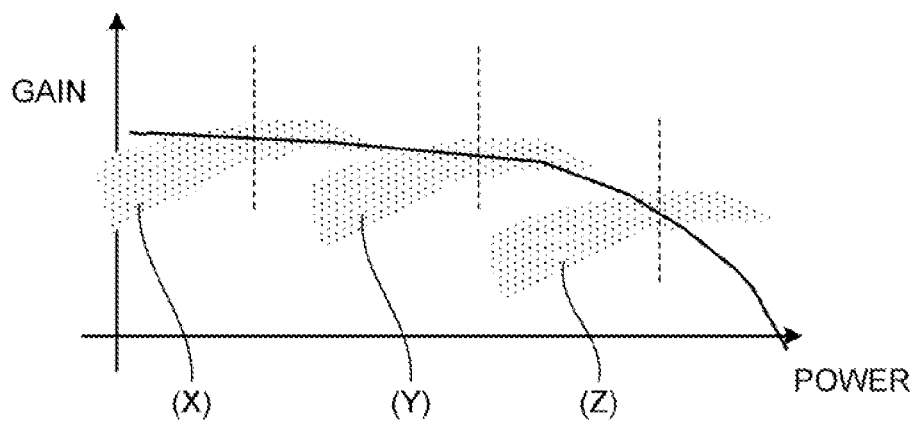
FIG. 1 is a schematic for explaining the relationship between the power of signals input to an amplifier and gain.

To begin with, a relationship between the power of signals input to an amplifier and gain will be explained with reference to FIG. 1. FIG. 1 is a schematic for explaining the relationship between the power of signals input to an amplifier and gain. In FIG. 1, the vertical axis represents gain, and the horizontal axis represents the power of signals input to the amplifier.

For example, in FIG. 1, the solid line representing gain characteristics renders the characteristic of a constant wave (CW) signal. In FIG. 1, the gain curves of modulated signals are represented as shaded. In FIG. 1, the dashed line represents the average power in the corresponding shaded region. The shaded region (X) in FIG. 1 indicates the gain curve of the modulated signals when the output power of the transmitter is relatively low; the shaded region (Y) indicates the gain curve of the modulated signals when the output power of the transmitter is higher than the example illustrated in (X); and the shaded region (Z) indicates the gain curve of the modulated signals when the output power of the transmitter is higher than the example illustrated in (Y). As it may be understood from (X), (Y) and (Z), even when the power changes, the gain characteristics of the modulated signals maintain similar figures while the power is shifted along with the change of the power. In other words, the amplifier input/output character-istics of the modulated signals having different average power are represented as similar figures taking different values.

Relationship Between Signals Input to Amplifier and Phase

Figure 2:
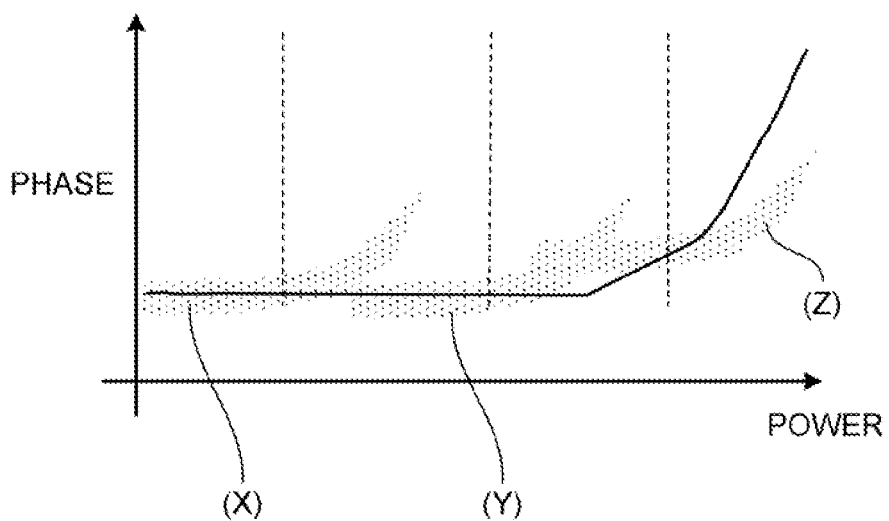
FIG. 2 is a schematic for explaining the relationship between the power of signals input to an amplifier and phase.

The relationship between the power of signals input to an amplifier and phase will be explained with reference to FIG. 2. FIG. 2 is a schematic for explaining the relationship between the power of signals input to an amplifier and phase. In FIG. 2, the vertical axis represents phase, and the horizontal axis represents the power of signals input to the amplifier.

For example, in FIG. 2, the solid line representing phase characteristics renders the characteristics of a constant wave (CW) signal. In FIG. 2, the phase characteristics of the modulated signals are represented as shaded. In FIG. 2, the dashed line represents the average power in the corresponding shaded region. The shaded region (X) in FIG. 2 indicates the phase curve of the modulated signals when the output power of the transmitter is relatively low; the shaded region (Y) indicates the phase curve of the modulated signals when the output power of the transmitter is higher than the example illustrated in (X); and the shaded region (Z) indicates the phase curve of the modulated signals when the output power of the transmitter is higher than the example illustrated in (Y). As it may be understood from (X), (Y) and (Z), even when the power changes, the phase characteristics of the modulated signals maintain similar figures while the power is shifted along with the change of the power. In other words, as explained for FIG. 1, the amplifier input/output characteristics of the modulated signals having different average power are represented as similar figures taking different values.

Configuration of Transmitter According to First Embodiment

Figure 3:
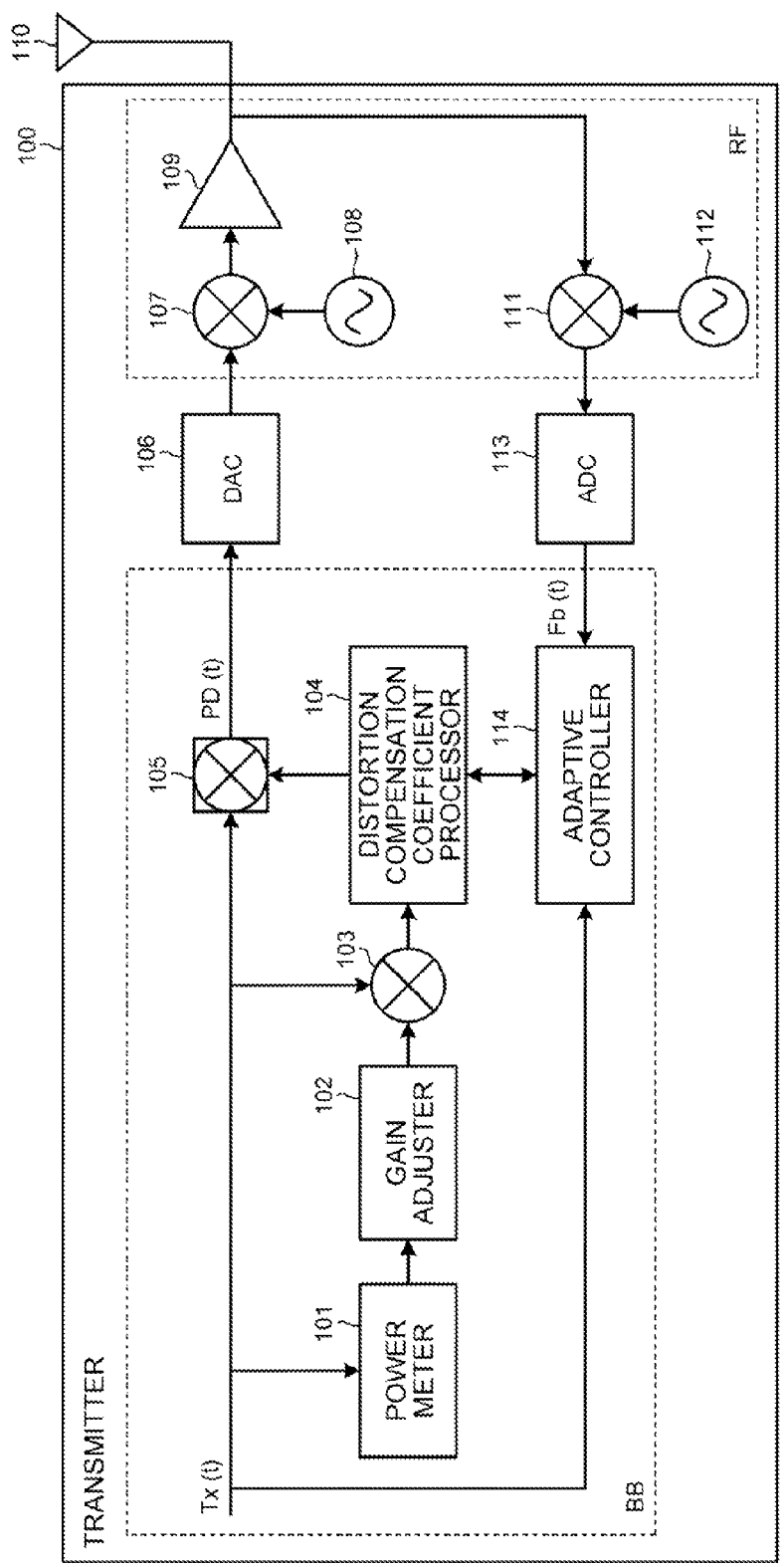
FIG. 3 is an example schematic of a configuration of a transmitter according to a first embodiment of the present invention.

A configuration of a transmitter according to a first embodiment of the present invention will now be explained with reference to FIG. 3. FIG. 3 is an example schematic of a configuration of the transmitter according to the first embodiment. For example, a transmitter 100 includes a power meter 101, a gain adjuster 102, a multiplier 103, a distortion compensation coefficient processor 104, a multiplier 105, a digital analog converter (DAC) 106, a multiplier 107, an oscillator 108, and an amplifier 109. The transmitter 100 also includes an antenna 110, a multiplier 111, an oscillator 112, an analog digital converter (ADC) 113, and an adaptive controller 114. The transmitter 100 is a transmitter such as one used in a base station device and that amplifies the power of transmission signals using an amplifier and outputs the amplified transmission signals. Such a transmission signal "Tx(t)" is input to the power meter 101, the multiplier 103, the multiplier 105, and the adaptive controller 114 as illustrated in FIG. 3. The multiplier 107, the oscillator 108, the amplifier 109, the multiplier 111, and the oscillator 112 are included in a radio frequency (RF) unit, and realized as an analog circuit. The power meter 101, the gain adjuster 102, the multiplier 103, the distortion compensation coefficient processor 104, the multiplier 105, and the adaptive controller 114 are included in baseband (BB) unit, and realized as a digital signal processor (DSP), a field programmable gate array (FPGA), a central processing unit (CPU), a digital circuit, or a memory, for example.

The power meter 101 measures the power of transmission signals output from a baseband signal processing unit, for example, and outputs the power thus measured to the gain adjuster 102. Based on the power measured by the power meter 101, the gain adjuster 102 compares, for example, the average of the power measured over a given length of time and the average power at the time of certain output power of the transmitter 100, and obtains a gain for adjusting the amplitude of the signals to that with the certain output power. After obtaining the gain, the gain adjuster 102 outputs the gain to the multiplier 103. The average power at the time of certain output power of the transmitter 100 means the average power in one of (X), (Y) and (Z) illustrated in FIG. 1, for example. The multiplier 103 then multiplies, for example, the transmission signals by the gain output from the gain adjuster 102, and outputs the result to the distortion compensation coefficient processor 104.

Figure 4:
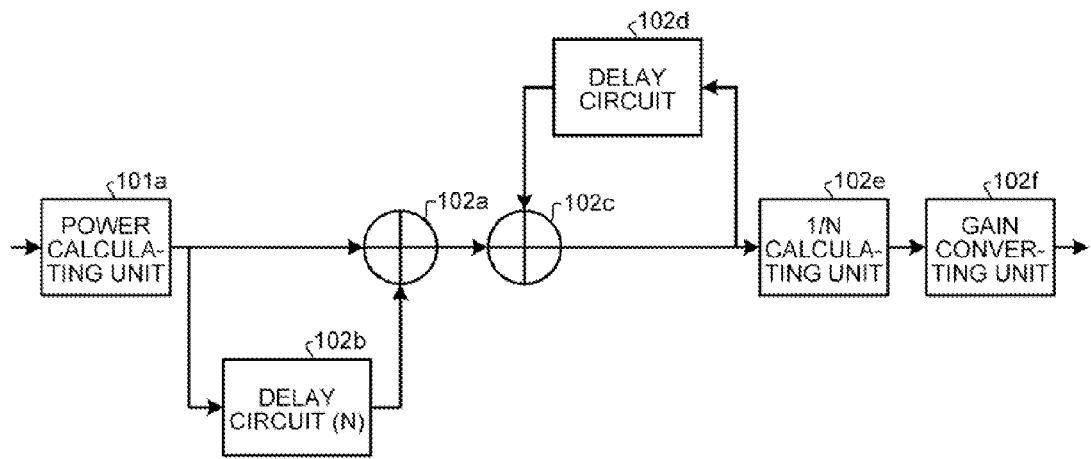
FIG. 4 is a schematic for explaining a power meter and a gain adjuster in detail.

The power meter 101 and the gain adjuster 102 will now be explained in detail with reference to FIG. 4. FIG. 4 is a schematic for explaining the power meter 101 and the gain adjuster 102 in detail. In the explanation of FIG. 4, it is assumed that the number of samples used in calculating the average of the power over the given length of time is N (where N is a natural number).

For example, the power meter 101 and the gain adjuster 102 correspond to a power calculating unit 101a, an adder 102a, a delay circuit (N) 102b, an adder 102c, a delay circuit 102d, an 1/N calculating unit 102e, and a gain converting unit 102f, as illustrated in FIG. 4.

The power calculating unit 101a measures the power of the transmission signals Tx(t) over a given length of time $t_0$ to $t_0+N-1$, for example, and outputs the results to the adder 102a and the delay circuit (N) 102b. Based on the values of the power received from the power calculating unit 101a, the adder 102a, the delay circuit (N) 102b, the adder 102c, and the delay circuit 102d output the sum of the power over the given length of time $t_0$ to $t_0+N-1$, that is, the sum of the N samples of the power, to the 1/N calculating unit 102e. At this time, the delay circuit (N) 102b outputs the latest power not included in the past N power from those received from the power calculating unit 101a to the adder 102a. The delay circuit 102d then outputs the power of the previous time period from those received from the adder 102c to the adder 102c.

The 1/N calculating unit 102e obtains the average power "ave (average)" from the sum of the N samples of the power received from the adder 102c, and outputs the result to the gain converting unit 102f, for example. The average power "ave" output from the 1/N calculating unit 102e is expressed by Equation (1) below. The gain converting unit 102f compares the average power "ave" received from the 1/N calculating unit 102e and an average "aveOpt (average option)" that is the average power at the time of the certain output power of the transmitter 100, and obtains a gain "G(ave)" from Equation (2), for example. In other words, in FIG. 4, when the transmission signal Tx is represented as a complex number Tx=Ich+jQch, the power P of an instantaneous signal is obtained by P=Ich*Ich+Qch*Qch, and the average power ave is obtained by obtaining the moving average of the N samples. The I-signal is an in-phase component signal, and the Q-signal is a quadrature component signal.

$$ave = \frac{\sum_{i=t_0}^{t_0+N-1} |Tx(t-i)|^2}{N} \quad (1)$$

$$G(ave) = \sqrt{\frac{aveOpt}{ave}} \quad (2)$$

Returning to the explanation of FIG. 3, the distortion compensation coefficient processor 104 obtains, for example, the distortion compensation coefficient corresponding to the power of the transmission signal output from the multiplier 103 from a lookup table (LUT). The distortion compensation coefficient processor 104 includes an LUT storing therein a value of the power of the transmission signal input to the amplifier 109 and at the time of the certain output power of the transmitter 100, and a distortion compensation coefficients used in compensating the distortion in the amplifier 109 in an associated manner. The LUT can be preconfigured, for example when the transmitter 100 is designed, and the LUT is updated after the distortion compensation process for the certain output power value. Generally speaking, depending on the characteristics of each amplifier used, the LUT will take different values after the distortion compensation process is applied. On the contrary, because, when the same amplifier is used, because the amplifier input/output characteristics of the modulated signals will indicate similar figures even when the average power is different, as explained with reference to FIGS. 1 and 2, the LUT will take values closer to each other after application of the distortion compensation process. In other words, when the same amplifier and a common LUT obtained by the application of the distortion compensation process are to be used, the distortion compensation coefficient corresponding to the power after the gain adjustment will be closer to an optimal value from the beginning, even when the power of the transmission signals changes. A value closer to the optimal value means a distortion compensation coefficient used in the distortion compensation process when the degree of the distortion in the amplifier output is small. The LUT does not have to be applied with the distortion compensation process in advance. This is because after the process according to the first embodiment is executed, the same LUT as that described above will be generated. The distortion compensation coefficient processor 104 then outputs the distortion compensation coefficient thus obtained to the multiplier 105.

The multiplier 105 executes, for example, the distortion compensation process by multiplying the transmission signal by the distortion compensation coefficient received from the distortion compensation coefficient processor 104, and outputs a predistortion signal "PD(t)" obtained as a result of the multiplication to the DAC 106. The DAC 106 is a conversion circuit that converts a digital signal to an analog signal, and converts, for example, the predistortion signal received from the multiplier 105 to an analog signal, and outputs the converted signal to the multiplier 107. The multiplier 107 converts, for example, the frequency of the analog signal received from the DAC 106 based on the frequency of the signal received from the oscillator 108, and outputs the converted predistortion signal to the amplifier 109. The oscillator 108 is a phase locked loop (PLL) circuit, for example, and detects a phase difference between an input signal and an output signal, oscillates a signal at a certain frequency by controlling a voltage controlled oscillator (VCO), and outputs the oscillated signal to the multiplier 107.

The amplifier 109, for example, amplifies the power of the predistortion signal received from the multiplier 107, and outputs the amplified signal to the antenna 110 and the multiplier 111 via a directional coupler, for example. The signal output to the multiplier 111 via the directional coupler will be used as a feedback signal "Fb(t)". The multiplier 111 converts, for example, the frequency of the feedback signal received from the amplifier 109 based on the frequency of the signal received from the oscillator 112, and outputs the converted feedback signal to the ADC 113. The oscillator 112 is a PLL circuit, for example, and detects a phase difference between an input signal and an output signal, oscillates a signal at a certain frequency by controlling a VCO, and outputs the oscillated signal to the multiplier 111. The ADC 113 is a conversion circuit for converting an analog signal to a digital signal, and converts, for example, the feedback signal received from the multiplier 111 to a digital signal, and outputs the converted signal to the adaptive controller 114.

The adaptive controller 114 obtains, for example, an error between the feedback signal Fb(t) received from the ADC 113 and the transmission signal Tx(t). The adaptive controller 114 then calculates an update for the distortion compensation coefficient stored in the LUT based on the error thus obtained, and updates the distortion compensation coefficient stored in the LUT with the update thus calculated. The distortion compensation coefficient updated by the adaptive controller 114 corresponds to the distortion compensation coefficient obtained by the distortion compensation coefficient processor 104.

Figure 5:
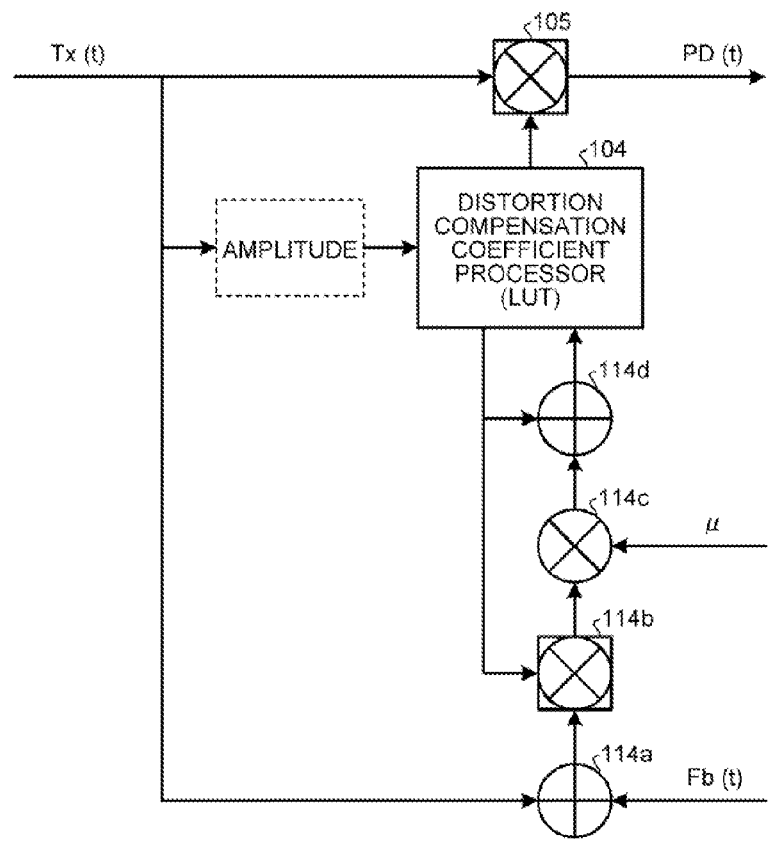
FIG. 5 is a schematic for explaining a distortion compensation coefficient processor, a multiplier, and an adaptive controller in detail.

The distortion compensation coefficient processor 104, the multiplier 105, and the adaptive controller 114 will now be explained in detail with reference to FIG. 5. FIG. 5 is a schematic for explaining the distortion compensation coefficient processor 104, the multiplier 105, and the adaptive controller 114 in detail. In the adaptive controller 114 corresponding to an adder 114a, a multiplier 114b, a multiplier 114c, and an adder 114d illustrated in FIG. 5, an adaptive control such as a least mean square (LMS) may be used in calculating an update for the distortion compensation coefficient.

As illustrated in FIG. 5, the adder 114a obtains, for example, a difference signal between the transmission signal Tx(t) and the feedback signal Fb(t), and outputs the difference signal thus obtained to the multiplier 114b. The multiplier 114b complex-multiplies, for example, the complex conjugate Fb*(t) of the feedback signal Fb(t) by the current distortion compensation coefficient received from the distortion compensation coefficient processor 104. The multiplier 114b then complex-multiplies the result of the complex-multiplication by the difference signal received from the adder 114a, and outputs the result to the multiplier 114c.

The multiplier 114c multiplies, for example, the result of the complex-multiplication received from the multiplier 114b by a step size parameter μ, and outputs the result to the adder 114d. The adder 114d adds, for example, the current distortion compensation coefficient received from the distortion compensation coefficient processor 104 to the multiplication result received from the multiplier 114b to obtain the new distortion compensation coefficient, which is the result of the addition. After obtaining the new distortion compensation coefficient, the adaptive controller 114 updates the distortion compensation coefficient contained in the LUT to the new distortion compensation coefficient. In other words, the adaptive controller 114 repeats the operations described above to obtain a new distortion compensation coefficient so as to reduce the difference signal between the transmission signal Tx(t) and the feedback signal Fb(t), and updates the LUT.

The distortion compensation coefficient processor 104 obtains the distortion compensation coefficient corresponding to the signal having amplitude adjusted by the gain adjuster 102, the multiplier 103, and the like from the LUT, and outputs the distortion compensation coefficient to the multiplier 105. The multiplier 105 multiplies, for example, the transmission signal Tx(t) by the distortion compensation coefficient received from the distortion compensation coefficient processor 104, and outputs the predistortion signal PD(t). Based on the above, the distortion compensation coefficient is expressed by Equation (3) when the distortion compensation coefficient is "h(|Tx(t)|)". When the difference signal is "e(t)", the difference signal is expressed by Equation (4).

$$h(|Tx(t)|)=h(|Tx(t)|)+\mu e(t)Fb^*(t) \quad (3)$$

$$e(t)=h(|Tx(t)|)Tx(t)-h(|Tx(t)|)Fb(t) \quad (4)$$

How to Use LUT

Figure 6:
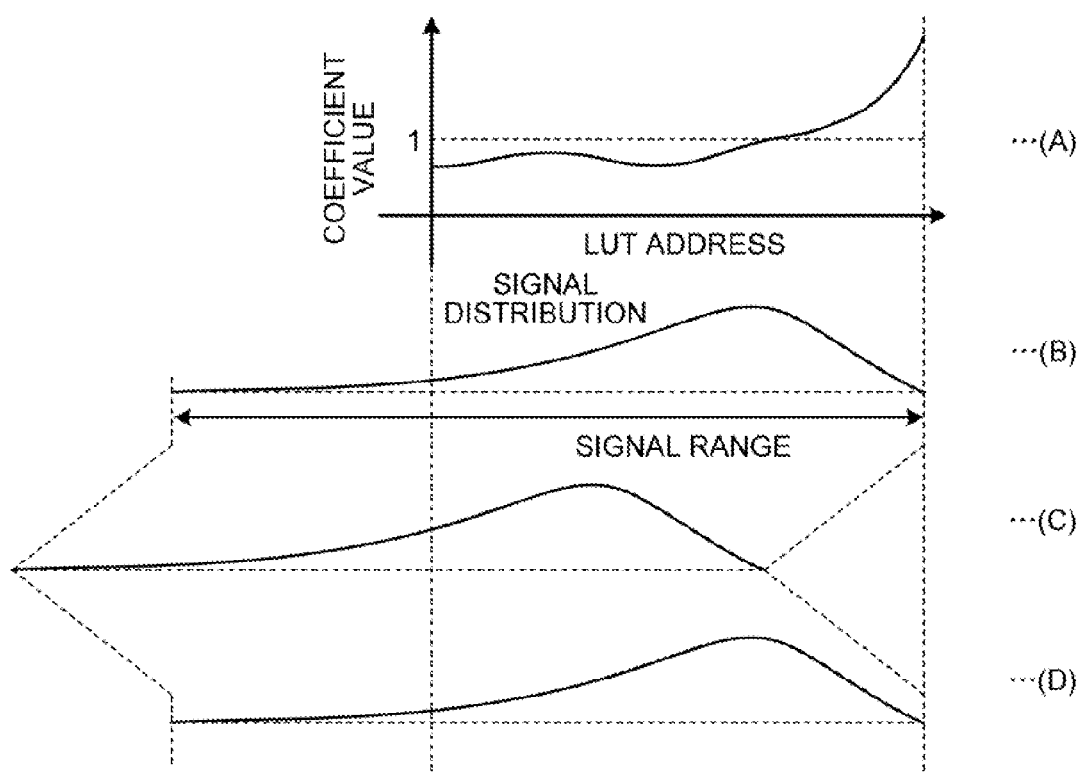
FIG. 6 is a schematic for explaining how an LUT is used.

Usage of the LUT will now be explained with reference to FIG. 6. FIG. 6 is a schematic for explaining how the LUT is used. (A) in FIG. 6 illustrates an LUT corresponding to (B) in FIG. 6. In (A) in FIG. 6, the vertical axis corresponds to the distortion compensation coefficient, and the horizontal axis represents LUT addresses. (B) in FIG. 6 indicates the distribution of the transmission signals at the time of the certain output power of the transmitter 100. (C) in FIG. 6 indicates the distribution of the transmission signals when the output power of the transmitter 100 is lower than the certain power. (D) in FIG. 6 is the signal distribution when the amplitude of the transmission signals illustrated in (C) in FIG. 6 is adjusted to (B) in FIG. 6. In (B) to (D) illustrated in FIG. 6, the vertical axis corresponds to the signal count, and the horizontal axis corresponds to the power. In other words, in (B) to (D) illustrated in FIG. 6, the average power will come near where the signal distribution is most concentrated, and the peak power will be at the right-hand end. In the explanation of FIG. 6 below, (B) in FIG. 6 corresponds to (Z) illustrated in FIG. 1, and (C) in FIG. 6 corresponds to (X) illustrated in FIG. 1.

For example, the transmitter 100 has the LUT illustrated in (A) in FIG. 6 corresponding to the power (Z) in FIG. 1 ((B) in FIG. 6). The transmitter 100 compares the average power illustrated in (B) and (C) in FIG. 6, obtains a gain for shifting the signal distribution in (C) in FIG. 6 to that in (D) in FIG. 6, and multiplies the transmission signals by the gain.

The transmitter 100 then obtains the distortion compensation coefficient corresponding to the power of the transmission signals shifted to (D) in FIG. 6 from the LUT, and executes the distortion compensation process by multiplying the original transmission signal that is the one before being shifted by the distortion compensation coefficient thus obtained. The transmitter 100 then updates the LUT in (A) in FIG. 6 based on the error signal between the feedback signal received from the amplifier and the transmission signal.

In the example explained in FIG. 6, the signal distribution is shifted to the right in FIG. 6 when the average power of the transmission signals is lower than the average power at the time of the certain output power. However, if the average power of the transmission signals is higher than the average power at the time of the certain output power, for example, the signal distribution will be shifted to the left in FIG. 6.

Distortion Compensation Process According to First Embodiment

Figure 7:
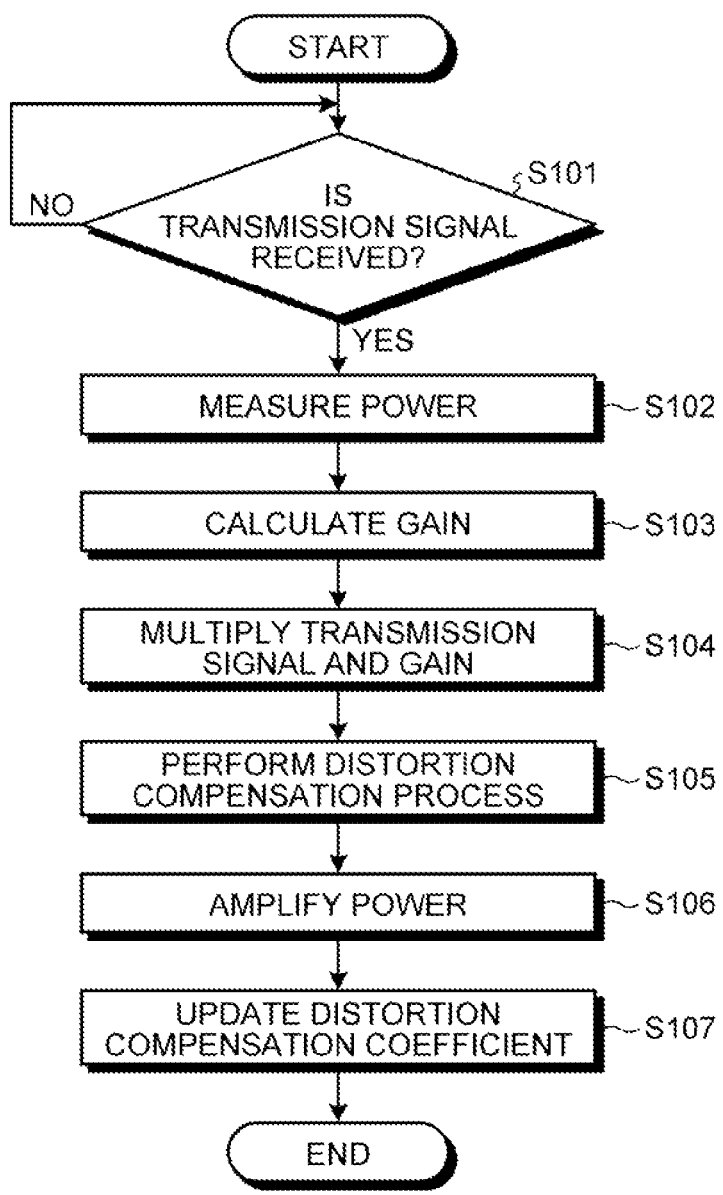
FIG. 7 is an example flowchart of a distortion compensation process according to the first embodiment.

The distortion compensation process according to the first embodiment will now be explained with reference to FIG. 7. FIG. 7 is an example flowchart of the distortion compensation process according to the first embodiment.

For example, as illustrated in FIG. 7, when a transmission signal is received from the baseband signal processing unit, for example (YES at S101), the transmitter 100 measures the power of the transmission signal (S102). At this time, if no transmission signal is received (NO at S101), the transmitter 100 waits for a transmission signal to be received.

Based on the power thus measured, the transmitter 100 compares the average of the power measured over the given length of time and the average of the power at the time of the certain output power of the transmitter 100, and calculates a gain (S103). The transmitter 100 then multiples the original transmission signal by the gain thus calculated (S104).

The transmitter 100 then obtains the distortion compensation coefficient corresponding to the power of the transmission signal after the multiplication from LUT, multiplies the original transmission signal by the distortion compensation coefficient thus obtained to perform the distortion compensation process (S105). The transmitter 100 then amplifies the power of the transmission signal applied with the distortion compensation process (S106). The transmitter 100 then obtains an error between the feedback signal that is the amplified signal and the original transmission signal, calculates an update of the distortion compensation coefficient based on the error thus obtained, and updates the distortion compensation coefficient stored in the LUT using the update thus calculated (S107). The transmitter 100 performs these processes repeatedly to converge the distortion compensation coefficients.

Effects Achieved by First Embodiment

As described above, the transmitter 100 maintains the LUT for a certain output power and, when the power changes, obtains the distortion compensation coefficient corresponding to the power of the transmission signal adjusted to the amplitude at the time of the certain output power from the LUT, and executes the distortion compensation process using the distortion compensation coefficient thus obtained. The transmitter 100 also calculates an update for a distortion compensation coefficient in the LUT based on the feedback signal received from the amplifier that amplifies the power of the transmission signal that is distortion-compensated and the transmission signal, and updates the distortion compensation coefficient in the LUT using the update value thus calculated. In other words, the transmitter 100 adjusts the gain to the amplitude of the signal at the time of the certain output power, performs the distortion compensation process using the LUT corresponding to the certain output power, and performs the process of updating the corresponding distortion compensation coefficient based on the feedback signal, for example. Furthermore, for the LUT corresponding to the certain output power, the transmitter 100 may use the LUT after the application of the distortion compensation process. As a result, when the power changes, the transmitter 100 can use a distortion compensation coefficient closer to the optimal value immediately after the power changes. Therefore, the transmitter 100 can reduce the number of times the distortion compensation coefficient stored in the LUT is updated. Thus, the speed at which the distortion compensation coefficients are converged can be improved. Furthermore, based on the fact that the amplifier input/output characteristics of modulated signals having different average power represent similar figures, the transmitter 100 uses a single LUT corresponding to the certain output power to execute the distortion compensation process. Therefore, the memory capacity can be reduced.

[b] Second Embodiment

Figure 8:
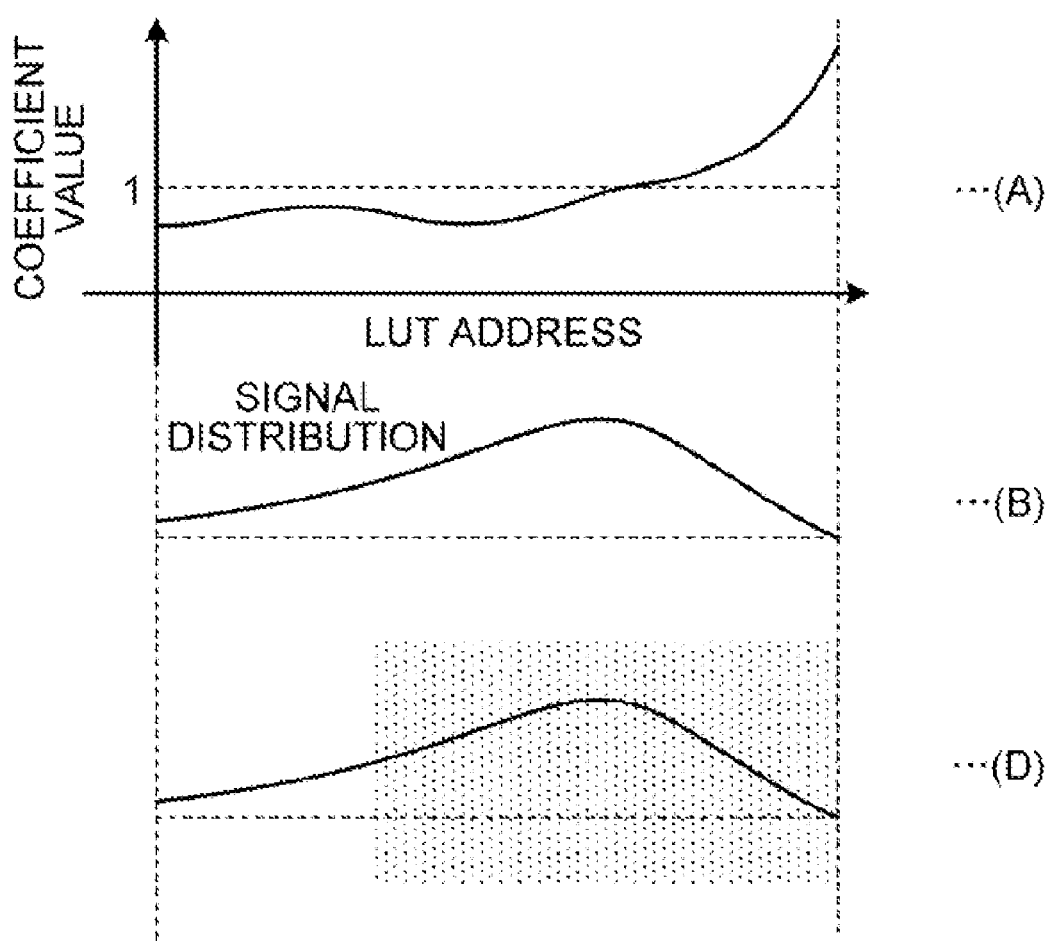
FIG. 8 is a schematic for explaining the limitation applied to updating of distortion compensation coefficients according to a second embodiment of the present invention.

Limitation Applied to Updating of Distortion Compensation Coefficients According to Second Embodiment A limitation applied to updating of the distortion compensation coefficients according to a second embodiment of the present invention will now be explained with reference to FIG. 8. FIG. 8 is a schematic for explaining the limitation applied to updating of the distortion compensation coefficients according to the second embodiment. (A) illustrated in FIG. 8 corresponds to (A) in FIG. 6, (B) illustrated in FIG. 8 corresponds to (B) in FIG. 6, and (D) illustrated in FIG. 8 corresponds to (D) in FIG. 6. The shaded region illustrated in (D) in FIG. 8 represents a range appearing in the LUT address in (C) illustrated in FIG. 6. Hereunder, this range may be referred to as an effective update range. In the second embodiment, because the configuration of the transmitter 100 is the same as that according to the first embodiment, the explanation thereof is omitted herein.

For example, as illustrated in FIG. 8, the transmitter 100 has the LUT, which is illustrated in (A) in FIG. 8, corresponding to the power in (Z) illustrated in FIG. 1 ((B) in FIG. 8). The transmitter 100 then compares the average power in (B) illustrated in FIG. 8 and that in (C) in FIG. 6, and obtains a gain for shifting the signal distribution illustrated in (C) in FIG. 6 to that illustrated in (D) in FIG. 8, and multiplies the transmission signal by the gain.

The transmitter 100 then obtains the distortion compensation coefficient corresponding to the power of the transmission signal after the signal distribution is shifted to (D) in FIG. 8 from the LUT, and uses the distortion compensation coefficient thus obtained to perform the distortion compensation process by multiplying the original transmission signal before being shifted by the distortion compensation coefficient. The transmitter 100 then updates the LUT illustrated in (A) in FIG. 8 based on an error signal between the feedback signal received from the amplifier and the transmission signal. At this time, it is preferable for the transmitter 100 to update only the distortion compensation coefficients corresponding to the power of the transmission signals within the effective update range illustrated in (D) in FIG. 8. In other words, the transmitter 100 updates the distortion compensation coefficients corresponding to the power of the transmission signals within the effective update range based on the difference between the average power at the time of the certain output power and the average of the power measured over the given length of time.

The reason why it is preferable for only the distortion compensation coefficients corresponding to the power of the transmission signals within the effective update range to be updated is, for example, because the LUT can only take limited values. In other words, in the second embodiment, the range where the LUT is updated is limited because the amplitude of the transmission signal at the time of the certain output power is different from that of the transmission signal at the time of output power that is not the certain output power. As illustrated in FIG. 8, for the transmission signals not included within the range of the LUT address corresponding to the certain output power, the distortion compensation coefficients corresponding to the power of such transmission signals are not updated. Therefore, the transmitter 100 may be configured not to use the distortion compensation coefficients corresponding to the power that is outside of the effective update range from those in the LUT that can take only limited values. Furthermore, the transmitter 100 may be configured to use the value at the leftmost position in (A) illustrated in FIG. 8 as a distortion compensation coefficient corresponding to the power outside of the effective update range from those stored in the LUT that can only take only limited values.

Effects Achieved by Second Embodiment

As described above, upon updating the LUT after the power changes, the transmitter 100 updates, for example, only the distortion compensation coefficients within the effective update range that is based on the difference between the average power at the time of the certain output power and the average power measured over the given length of time. Therefore, the distortion compensation process can be stabilized. In other words, when the transmitter 100 is using a common LUT that can take only limited values and the power of the signal before being applied with the gain adjustment is outside of the range of the LUT, the corresponding distortion compensation coefficient is not in the LUT. Therefore, the updates of the distortion compensation coefficients corresponding to the power of the signals after the gain adjustment is limited as well to stabilize the distortion compensation process.

[c] Third Embodiment

Configuration of Transmitter According to Third Embodiment

Figure 9:
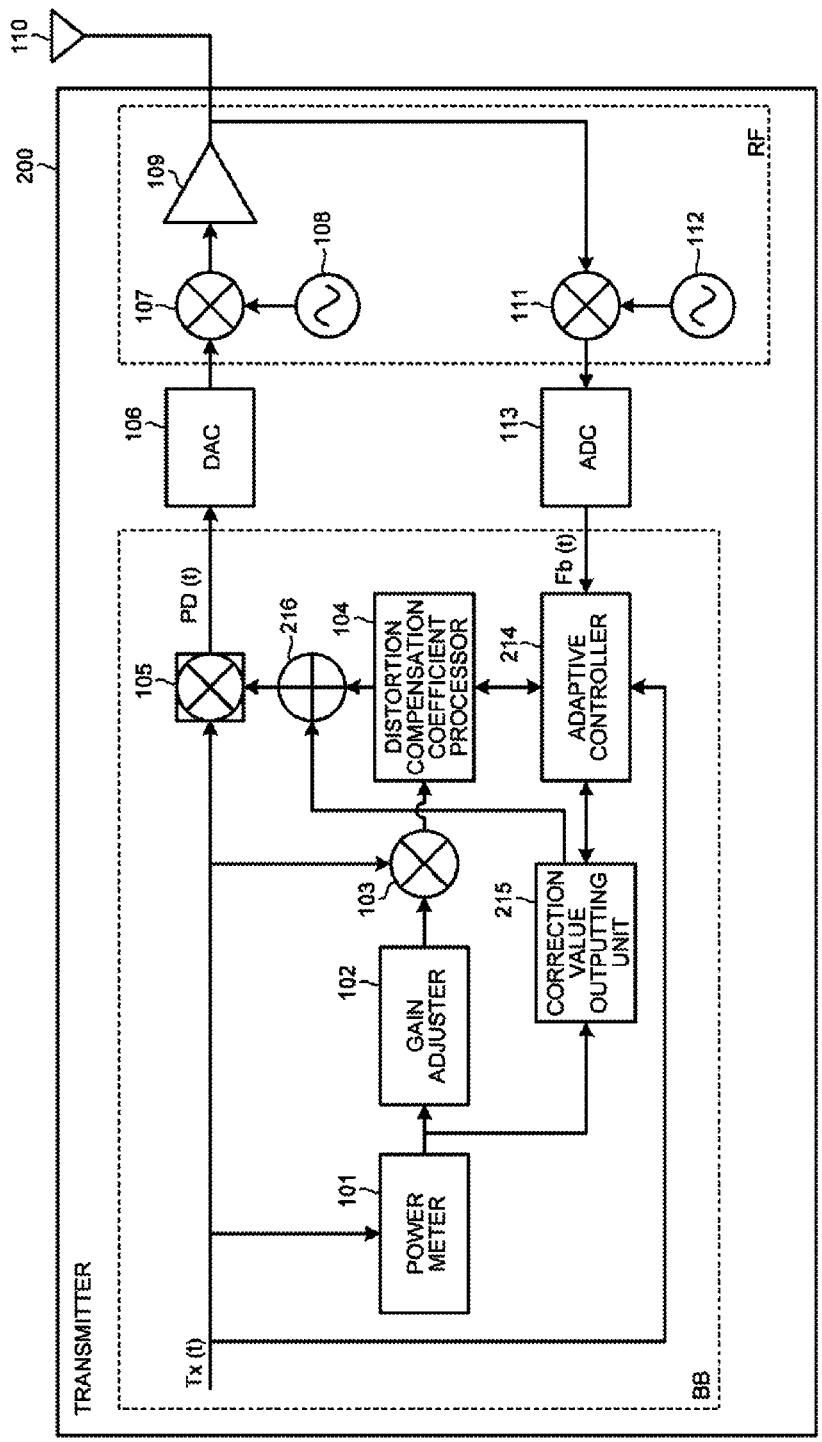
FIG. 9 is an example schematic of a configuration of a transmitter according to a third embodiment of the present invention.

A configuration of a transmitter according to a third embodiment of the present invention will now be explained with reference to FIG. 9. FIG. 9 is an example schematic of a configuration of the transmitter according to the third embodiment. In the third embodiment, the elements having the same functions as those in the transmitter 100 according to the first embodiment are assigned with the same reference numerals, and explanations thereof are omitted herein.

For example, as illustrated in FIG. 9, a transmitter 200 includes the power meter 101, the gain adjuster 102, the multiplier 103, the distortion compensation coefficient processor 104, the multiplier 105, the DAC 106, the multiplier 107, the oscillator 108, and the amplifier 109. The transmitter 200 also includes the antenna 110, the multiplier 111, the oscillator 112, the ADC 113, and an adaptive controller 214. The transmitter 200 also includes a correction value output unit 215, and an adder 216. The multiplier 107, the oscillator 108, the amplifier 109, the multiplier 111, and the oscillator 112 are included in the RF unit, and realized as an analog circuit. The power meter 101, the gain adjuster 102, the multiplier 103, the distortion compensation coefficient processor 104, the multiplier 105, the adaptive controller 214, the correction value output unit 215, and the adder 216 are included in the BB unit, and realized as a DSP, a FPGA, a digital circuit, a memory, or the like.

The correction value output unit 215 includes, for example, a correction value table storing therein a difference between the average power at the time of the certain output power and the average power at the time of output power other than the certain output power, and a correction value for correcting the distortion compensation coefficients in an associated manner. The correction value output unit 215 obtains, for example, a correction value for correcting the distortion compensation coefficient corresponding to the difference between the average power at the time of the certain output power and the average of the power measured over the given length of time from the correction value table, and outputs the correction value to the adder 216. The adder 216, for example, uses the correction value received from the correction value output unit 215 for adding it to the distortion compensation coefficient received from the distortion compensation coefficient processor 104 to correct the distortion compensation coefficient, and outputs the distortion compensation coefficient thus corrected to the multiplier 105. The multiplier 105 multiplies the transmission signal by the corrected distortion compensation coefficient received from the adder 216, and performs the distortion compensation process.

The adaptive controller 214 obtains, for example, an error between the feedback signal Fb(t) received from the ADC 113 and the transmission signal Tx(t). The adaptive controller 214 then calculates an update for the correction value stored in the correction value table based on the error thus obtained, and updates the correction value stored in the correction value table using the update value thus calculated.

In this example, the adaptive controller 214 may update the correction value stored in the correction value table only when the difference between the average of the power measured over the given length of time and the instantaneous power of the transmission signal is smaller than a certain value. Furthermore, it is preferable for the correction value to be updated when a condition that the average power and the instantaneous power are equal is met. At this time, the adaptive controller 214 turns OFF updating of the distortion compensation coefficients stored in the LUT exclusively to the updating of the correction value table. In other words, if the average power and the instantaneous power are equal to or lower than a certain level, the changes in the distortion compensation coefficients become small even if the distortion compensation coefficients are updated any further by performing the gain adjustment. Therefore, the adaptive controller 214 may update only the correction value table based on the power change.

Figure 10A:
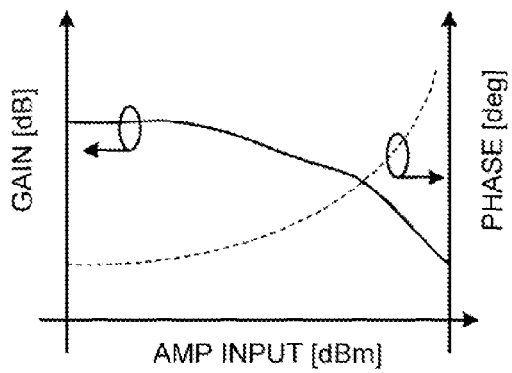
FIG. 10A is a schematic of amplifier characteristics.
Figure 10B:
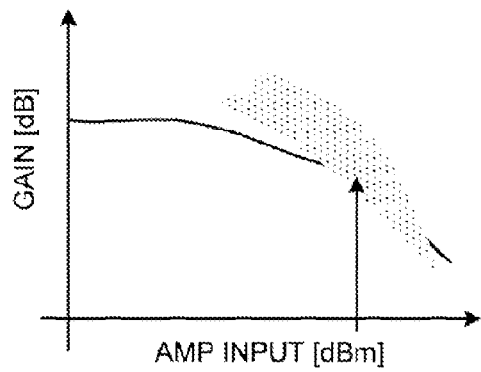
FIG. 10B is a schematic of a region of modulated signals resulting in relatively high average output power and gain characteristic.
Figure 10C:
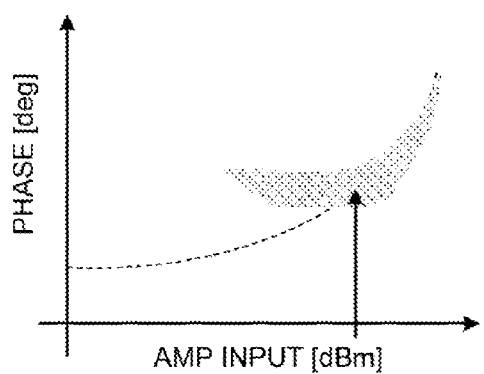
FIG. 10C is a schematic of a region of the modulated signals resulting in relatively high average output power and phase characteristic.
Figure 10D:
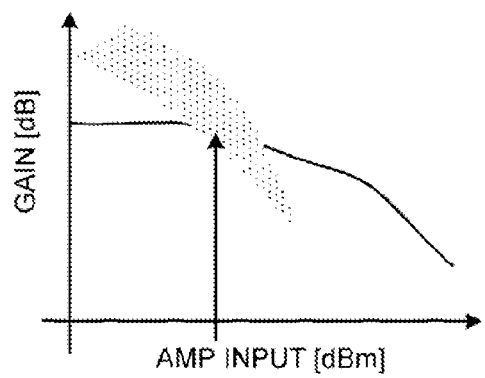
FIG. 10D is a schematic of a region of modulated signals resulting in relatively low average output power and gain characteristic.
Figure 10E:
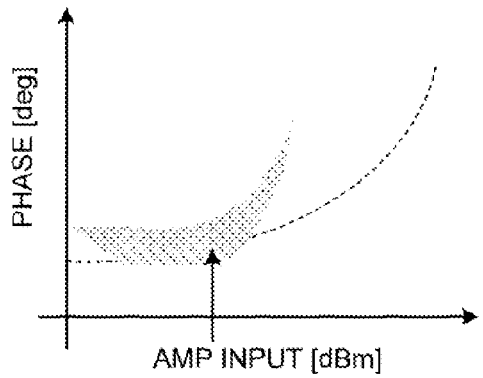
FIG. 10E is a schematic of a region of modulated signals resulting in relatively low average output power and phase characteristic.

The reason why the distortion compensation coefficients are corrected depending on the power difference will now be explained using FIGS. 10A to 10E. FIG. 10A is a schematic of amplifier characteristics. FIG. 10B is a schematic of a region of modulated signals resulting in relatively high average output power and gain characteristic. FIG. 10C is a schematic of a region of the modulated signals resulting in relatively high average output power and phase characteristic. FIG. 10D is a schematic of a region of modulated signals resulting in relatively low average output power and gain characteristic. FIG. 10E is a schematic of a region of modulated signals resulting in relatively low average output power and phase characteristic.

In FIGS. 10A to 10E, the vertical axis corresponds to the gain or the phase, and the horizontal axis corresponds to the amplifier input. More specifically, the vertical axis taking a smaller value when the amplifier input is higher represents the gain characteristic, and the vertical axis taking a larger value when the amplifier input is higher represents the phase characteristic. The arrows illustrated in FIGS. 10B to 10E indicate the positions of the average power of the modulated signals. As it may be understood from FIGS. 10B and 10D, or FIGS. 10C and 10E, when modulated signals are used, both of the gain characteristic and the phase characteristic are shifted by the difference in the average power. In other words, in a technique where the distortion compensation coefficients are shifted depending on the power change, such as those explained in the first and the second embodiments, the gain characteristic and the phase characteristic are simply moved up or down. Therefore, the distortion compensation coefficients may deviate from the optimal values by a large degree. Therefore, in the third embodiment, the distortion compensation coefficients are corrected to suppress the deviation from being large. The process according to the third embodiment does not have to be performed when the gain characteristic of the amplifier is constant.

Correction Value Outputting Process According to Third Embodiment

Figure 11:
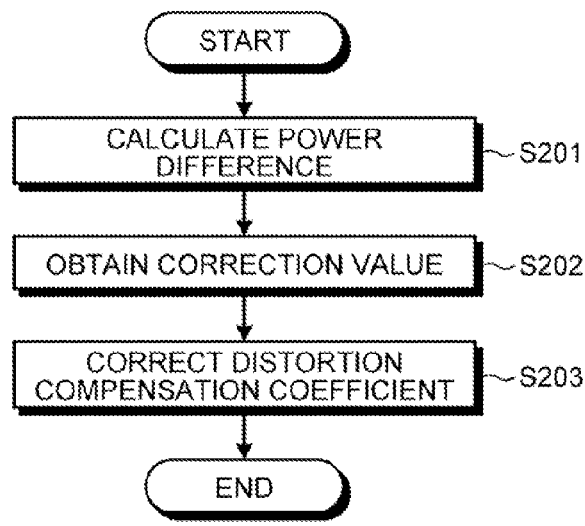
FIG. 11 is an example flowchart of a correction value outputting process according to the third embodiment.

A correction value outputting process according to the third embodiment will be explained with reference to FIG. 11. FIG. 11 is an example flowchart of a correction value outputting process according to the third embodiment.

For example, as illustrated in FIG. 11, the transmitter 200 calculates the difference between the average power at the time of the certain output power and the average of the power measured over the given length of time (S201). The transmitter 200 then obtains correction value corresponding to the difference thus calculated from the correction value table (S202). The transmitter 200 corrects the distortion compensation coefficient using the correction value thus obtained (S203). The transmitter 200 performs the distortion compensation process using the distortion compensation coefficient thus corrected.

Effects Achieved by Third Embodiment

As described above, the transmitter 200 corrects the distortion compensation coefficient using a correction value obtained from the difference between the average power at the time of the certain output power and the average of the power measured over the given length of time, and performs the distortion compensation process using the distortion compensation coefficient thus corrected. As a result, because, the transmitter 200 corrects the distortion compensation coefficient corresponding to the transmission signal that is gain-adjusted by using the correction value that is based on the power difference before performing the distortion compensation process, the convergence speed of the distortion compensation coefficients can be improved while suppressing the degradation of the communication quality.

[d] Fourth Embodiment

Some embodiments of the transmitter disclosed in the present application are explained above. However, the present invention may be implemented in various embodiments other than those explained above. Therefore, various other embodiments will now be explained in "Configurations of Transmitter" below.

Configurations of Transmitter

Processing or controlling procedures, specific names, and information including various types of data and parameters (for example, contents of the LUT or the correction value table) mentioned herein or in the drawings may be modified in any way except where specified otherwise.

Furthermore, each of the elements such as the transmitter 100 illustrated in the drawings is merely a functional and conceptual depiction, and is not necessary have to be physically configured in the manner illustrated in the drawings. In other words, specific configurations of distribution or integration of the apparatuses are not limited to those illustrated in the drawings, and the whole or a part of the apparatuses may be functionally or physically distributed or integrated in any units depending on various loads or utilization.

Figure 12:
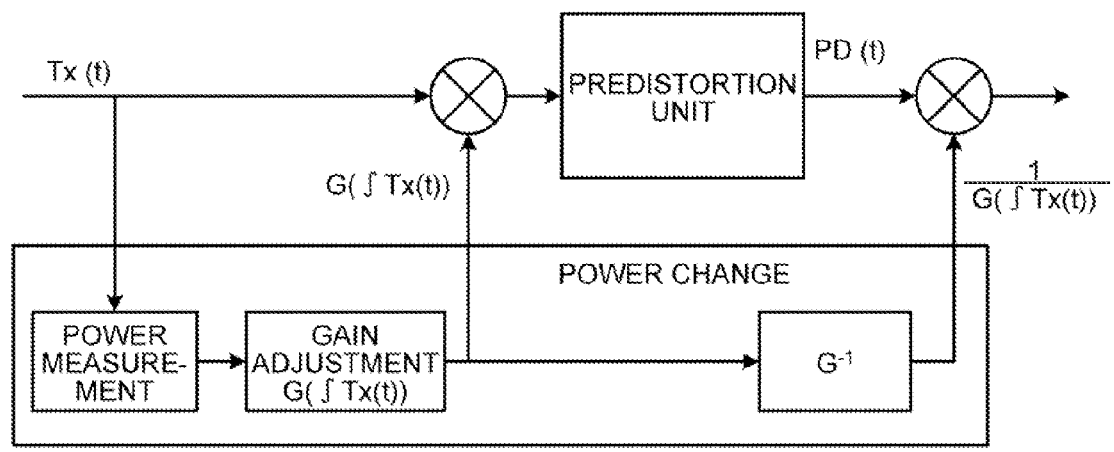
FIG. 12 is an example schematic of a configuration of a different transmitter from those according to the first to the third embodiments.

FIG. 12 is an example schematic of a configuration of a transmitter that is different from those according to the first to the third embodiments. For example, as illustrated in FIG. 12, the transmitter applies a gain G to a transmission signal, and applies the inverse number of the gain G to the predistortion signal having applied with the distortion compensation process. In this example, the predistorter illustrated in FIG. 12 corresponds to the distortion compensation coefficient processor 104. In this manner, the transmitter can improve the convergence speed of the distortion compensation coefficients regardless of whether the distortion compensation is series-based or LUT-based.

Figure 13:
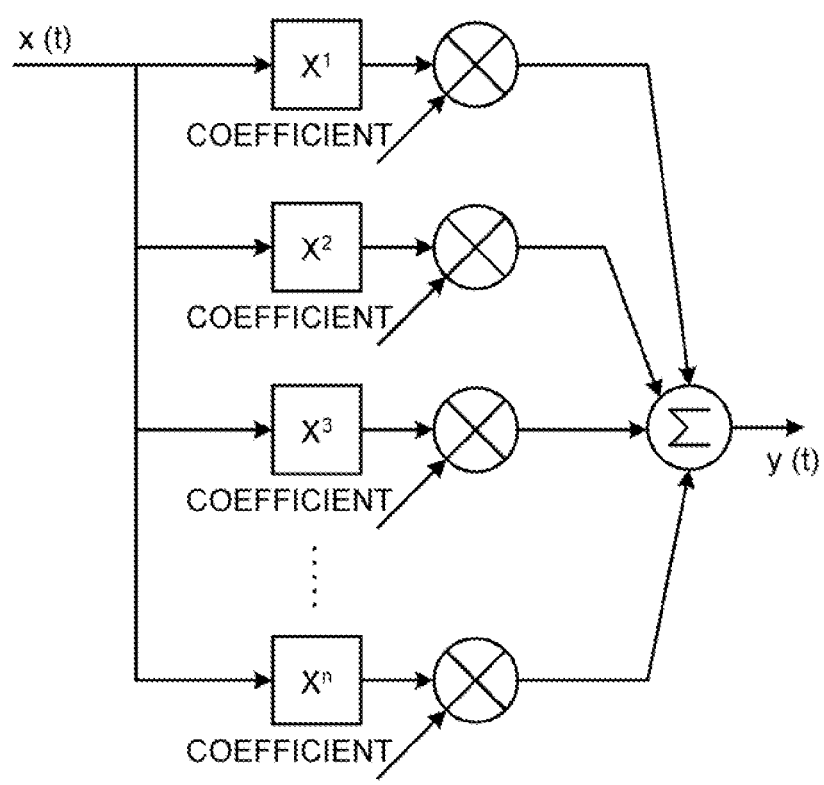
FIG. 13 is an example schematic of a configuration of series-based distortion compensation.

FIG. 13 is an example schematic of a configuration of series-based distortion compensation. For example, as illustrated in FIG. 13, a transmitter generates higher-order signals for an input signal x(t), and multiples a coefficient prepared for each order to each of these signals. The transmitter synthesizes all of the signals applied with the multiplication to generate a distortion compensation signal. As illustrated in FIG. 12, when the power changes, the transmitter increases the input signal by the gain G, and decreases the predistortion signal PD(t) by 1/G.

One embodiment of the transmitter and the distortion compensating method disclosed in the present application has the effects to improve the convergence speed of distortion compensation coefficients.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A transmitter executing a distortion compensation process for compensating for a distortion in an output of an amplifier in advance by applying a reverse characteristic to a transmission signal before being amplified by the amplifier, the transmitter comprising:
    a distortion compensation coefficient storage unit that stores therein a value of power of a transmission signal and a distortion compensation coefficient that is used in the distortion compensation process in an associated manner;
    a power meter that measures power of the transmission signal before application of the distortion compensation process;
    a gain adjusting unit that adjusts a gain for the transmission signal before application of the distortion compensation process, when power of a transmission signal changes at certain timing based on an average of the power measured by the power meter, correspondingly to amplitude of the transmission signal at the certain timing;
    a distortion compensation processing unit that obtains a distortion compensation coefficient corresponding to the value of power of the transmission signal after being adjusted by the gain adjusting unit from the distortion compensation coefficient storage unit, and performs the distortion compensation process to the transmission signal using the distortion compensation coefficient thus obtained; and
    a distortion compensation coefficient updating unit that calculates an update for the distortion compensation coefficient stored in the distortion compensation coefficient storage unit and corresponding to the distortion compensation coefficient obtained by the distortion compensation processing unit based on an error between power of the transmission signal amplified by the amplifier and power of the transmission signal before the application of the distortion compensation process, and updates the distortion compensation coefficient stored in the distortion compensation coefficient storage unit using the update thus calculated.

2. The transmitter according to claim 1, wherein the distortion compensation coefficient updating unit limits updating of distortion compensation coefficients outside of a given range of the value of the power at the certain timing and stored in the distortion compensation coefficient storage unit.

3. The transmitter according to claim 1, further comprising:
    a correction value output unit that outputs a correction value for correcting the distortion compensation coefficient corresponding to a difference between an average of the value of the power at the certain timing and an average of power measured by the power meter over a given length of time, wherein
    the distortion compensation processing unit corrects the obtained distortion compensation coefficient using the correction value output by the correction value output unit, and applies the distortion compensation process to the transmission signal using the distortion compensation coefficient thus corrected.

4. The transmitter according to claim 3, wherein the distortion compensation coefficient updating unit updates the correction value when a difference between the average of the power measured by the power meter over the given length of time and instantaneous power of the transmission signal is equal to or smaller than a certain value.

5. A distortion compensating method comprising:

measuring power of a transmission signal before application of a distortion compensation process for compensating for a distortion in an output of an amplifier in advance by applying a reverse characteristic to the transmission signal before being amplified by the amplifier;

adjusting a gain for the transmission signal before the application of the distortion compensation process, when power of a transmission signal changes at certain timing based on an average of power measured at the measuring, correspondingly to amplitude of the transmission signal at the certain timing;

obtaining a distortion compensation coefficient corresponding to a value of power of the transmission signal adjusted at the adjusting from a storage unit storing therein a value of power of a transmission signal and a distortion compensation coefficient that is used in the distortion compensation process in an associated manner;

applying the distortion compensation process to the transmission signal using the distortion compensation coefficient obtained at the obtaining;

calculating an update for the distortion compensation coefficient stored in the storage unit and corresponding to the distortion compensation coefficient obtained at the obtaining based on an error between power of the transmission signal amplified by the amplifier and power of the transmission signal before the application of the distortion compensation process; and updating the distortion compensation coefficient stored in the storage unit using the update calculated at the calculating.

6. A transmitter comprising:

a memory; and a processor coupled to the memory, wherein the processor executes a process comprising:

measuring power of a transmission signal before application of a distortion compensation process for compensating for a distortion in an output of an amplifier in advance by applying a reverse characteristic to the transmission signal before being amplified by the amplifier;

adjusting a gain for the transmission signal before the application of the distortion compensation process, when power of a transmission signal changes at certain timing based on an average of power measured at the measuring, correspondingly to amplitude of the transmission signal at the certain timing;

obtaining a distortion compensation coefficient corresponding to a value of power of the transmission signal adjusted at the adjusting from a storage unit storing therein a value of power of a transmission signal and a distortion compensation coefficient that is used in the distortion compensation process in an associated manner;

applying the distortion compensation process to the transmission signal using the distortion compensation coefficient obtained at the obtaining;

calculating an update for the distortion compensation coefficient stored in the storage unit and corresponding to the distortion compensation coefficient obtained at the obtaining based on an error between power of the transmission signal amplified by the amplifier and power of the transmission signal before the application of the distortion compensation process; and updating the distortion compensation coefficient stored in the storage unit using the update calculated at the calculating.

* * * * *